(12) United States Patent
Ganai et al.

(10) Patent No.: US 7,853,906 B2
(45) Date of Patent: Dec. 14, 2010

(54) ACCELERATING HIGH-LEVEL BOUNDED MODEL CHECKING

(75) Inventors: Malay Ganai, Plainsboro, NJ (US);
Aarti Gupta, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 279 days.

(21) Appl. No.: 11/689,803

(22) Filed: Mar. 22, 2007

(65) Prior Publication Data

US 2007/0226665 A1  Sep. 27, 2007

Related U.S. Application Data

(60) Provisional application No. 60/743,647, filed on Mar. 22, 2006.

(51) Int. Cl.
*G06F 9/45* (2006.01)
*G06F 17/50* (2006.01)

(52) U.S. Cl. .............. 716/5; 716/1; 716/3; 714/38; 717/104; 717/124; 717/141; 703/2; 703/15; 703/22

(58) Field of Classification Search ............... 716/4–5, 716/1, 3; 703/2, 15, 22; 717/104, 124, 141; 714/38
See application file for complete search history.

(56) References Cited

U.S. PATENT DOCUMENTS

| | | | | |
|---|---|---|---|---|
| 7,318,205 | B2 * | 1/2008 | Levitt et al. ............... | 716/4 |
| 2004/0019468 | A1 * | 1/2004 | De Moura et al. .......... | 703/2 |
| 2007/0118340 | A1 * | 5/2007 | Geist et al. ............... | 703/2 |
| 2008/0072190 | A1 * | 3/2008 | Jain et al. ............... | 716/5 |

OTHER PUBLICATIONS

"Iterative Abstraction using SAT-based BMC with proof Analysis", by Aarti Gupta, Malay Ganai, Zijiang Yang, Pranav Ashar, ICCAD, Nov. 11-13, 2003, pp. 416-423, @2003 ACM.*
"Bounded Model Checking for Timed Systems", by G. Audemard, A. Cimatti, A. Kornilowicz, and R. Sebastiani, @ Springer-Verlag Berlin Heidelberg 2002.*
* cited by examiner

*Primary Examiner*—Paul Dinh
*Assistant Examiner*—Nha T Nguyen
(74) *Attorney, Agent, or Firm*—Jeffrey Brosemer; Joseph Kolodka

(57) ABSTRACT

An accelerated High-Level Bounded Model Checking method that efficiently extracts high-level information from the model, uses that extracted information to obtain an improved verification model, and applies relevant information on-the-fly to simplify the BMC-problem instances.

5 Claims, 5 Drawing Sheets

1. Input: G(V, E^f, r)
2. Output: W: E->Z, W: V->Z
3. Procedure: BalancePath
4. S = {v | v is a sink node}
5. W(r) = 0; ∀v∈V, v≠r W(v) =∞;
6. ∀v∈S *BalanceAux*(v);

7. Input: v
8. Output: W(v)
9. Proecedure: BalanceAux
10. ∀u∈from(v)
11. if (W(u) ==∞) BalanceAux(u);
12. W(v) = Max_{u∈from(v)} (W(u)) +1;
13. ∀u∈from(v), W(u,v) =W(v)-W(u)-1;

*FIG. 3*

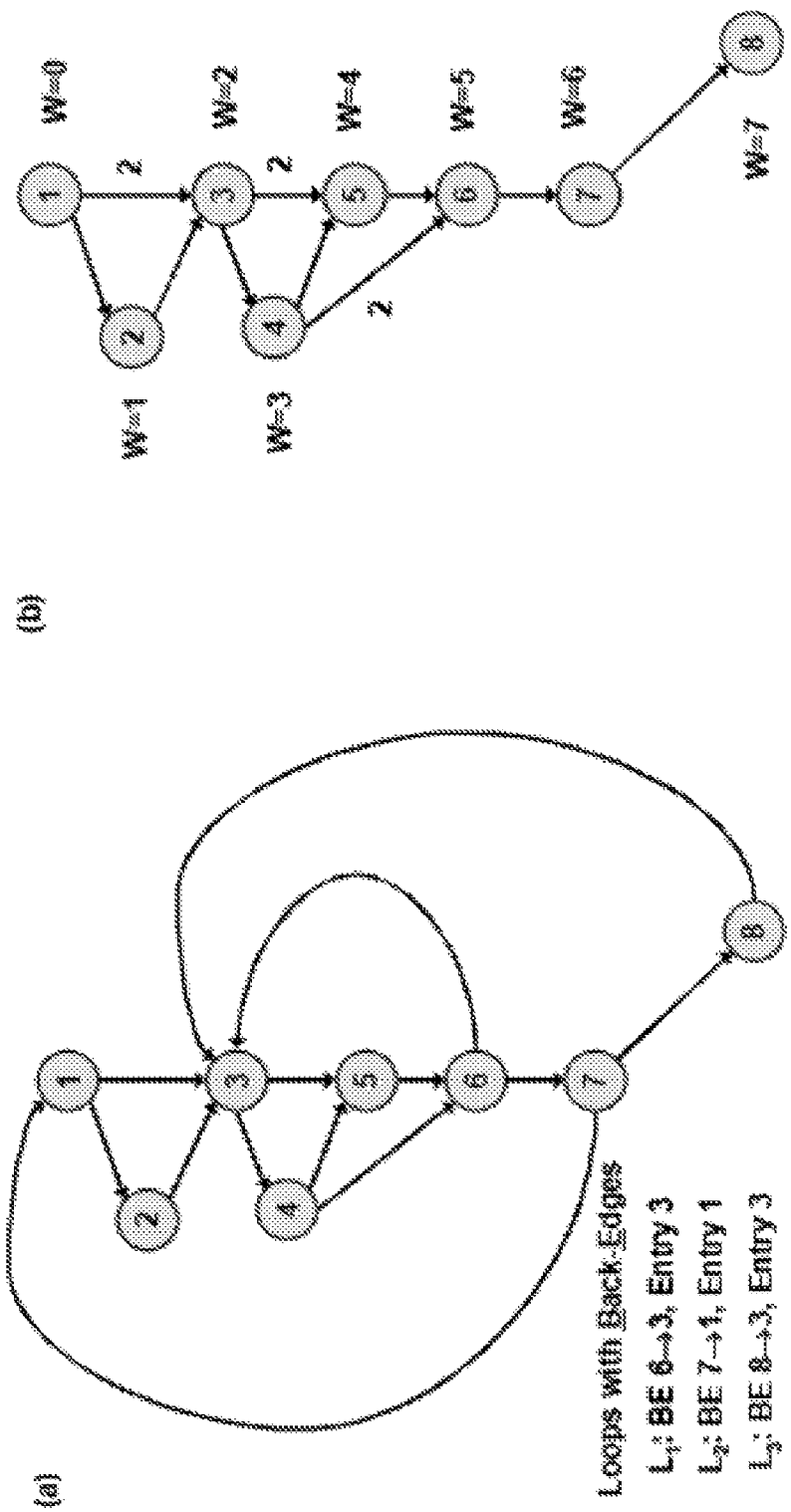
FIG. 4 (a-b)

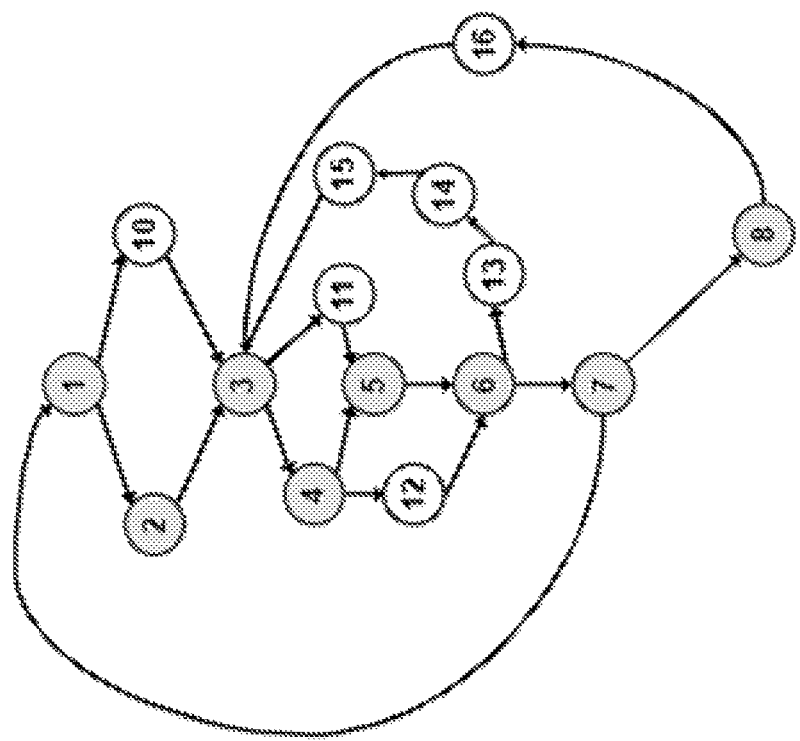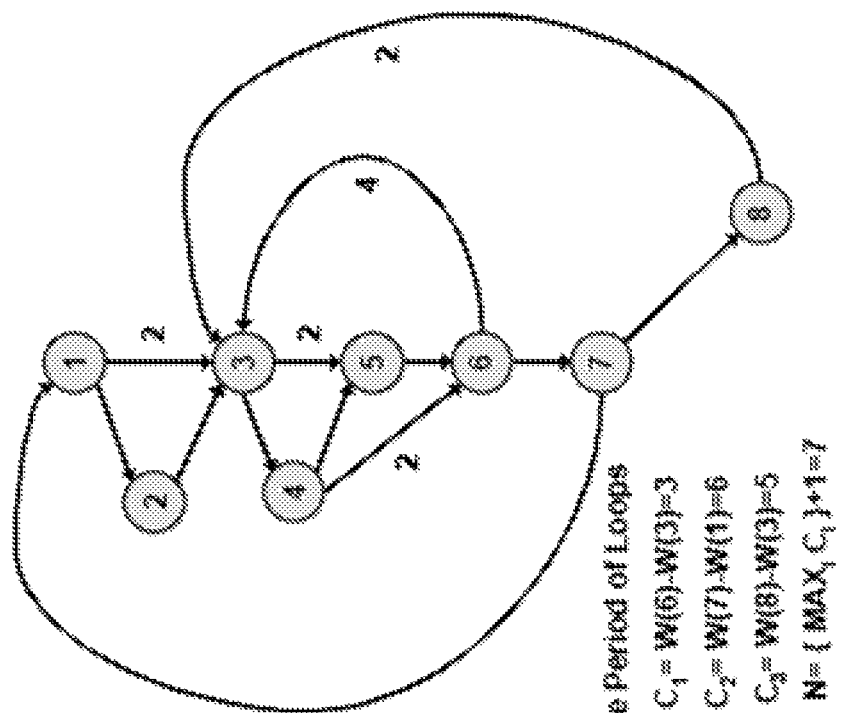
FIG. 4 (c-d)

ACCELERATING HIGH-LEVEL BOUNDED MODEL CHECKING

CROSS REFERENCE TO RELATED APPLICATIONS

This application claims the benefit of U.S. Provisional Patent Application No. 60/743,647 filed Mar. 22, 2006 the entire contents and file wrapper of which are incorporated by reference as if set forth at length herein.

FIELD OF THE INVENTION

This invention relates generally to the field of software development and in particular it relates to improved methods for program verification employing high level bounded model checking methodologies.

BACKGROUND OF THE INVENTION

To address the increasing design complexity and size associated with contemporary software systems, it is generally recognized that new or improved software verification methodologies would represent a significant advance in the art. Accordingly, we describe such methods and techniques which advance high-level bounded model checking (BMC) and high-level synthesis as applied to verification.

SUMMARY OF THE INVENTION

An advance is made in the art according to the principle of the present invention whereby high-level BMC is enhanced through efficient extraction of high-level information, using that information to obtain a "BMC friendly" verification model, and applying only relevant information on-the-fly to simply BMC-problem instances.

According to the present invention, several techniques to efficiently perform high-level BMC using a Satisfiability Modulo Theory (SMT) solver that not only overcomes the inherent limitations of Boolean SAT-based Boolean-level BMC but also allow the integration of state-of-the-art innovations adopted for Boolean-level BMC. Our high-level description includes a decidable quantifier-free fragment of first-order logic, including Presburger arithmetic, uninterpreted functions and predicates, and arrays.

More specifically, a high-level BMC framework according to the present invention will 1. use expression simplification to reduce unroll formula size not only within a time-frame but across time-frames; 2. extract high-level information such as control-flow of the program design efficiently; 3. use the high-level information to simplify and reduce an unrolled formula size; 4. provide only relevant high-level information during unroll on-the-fly to the high-level solver at each call to Solve, without overburdening the high-level solver; 5. allow incremental learning, i.e., reuse previously learned lemmas from overlapping BMC instances to improve Solver search; and 6. transform the model using Cone-of-influence (COI) reduction, Collapsing, and Balancing Paths and Loops, so as to improve the scope of learning and simplification while using high level information.

DESCRIPTION OF THE DRAWING

Further features and advantages will become apparent with reference to the following drawing in which:

FIG. 3 is a pseudo-code listing of procedure BalancePath according to the present invention;

FIG. 4(a)-4(d) show execution steps of balancing re-convergence on example a) Reducible Flow Graph $G(V,E,v_i)$ where i represents the node $v_i$; b) DAG $G(V,E^f,v_1)$ with edge weights (=1 if not otherwise shown) after executing Balance-Path procedure; c) weights on back-edges after balancing loops; and d) final balanced flow graph after inserting n−1 NOP states for edge with weights n.

DETAILED DESCRIPTION

Figure 1:
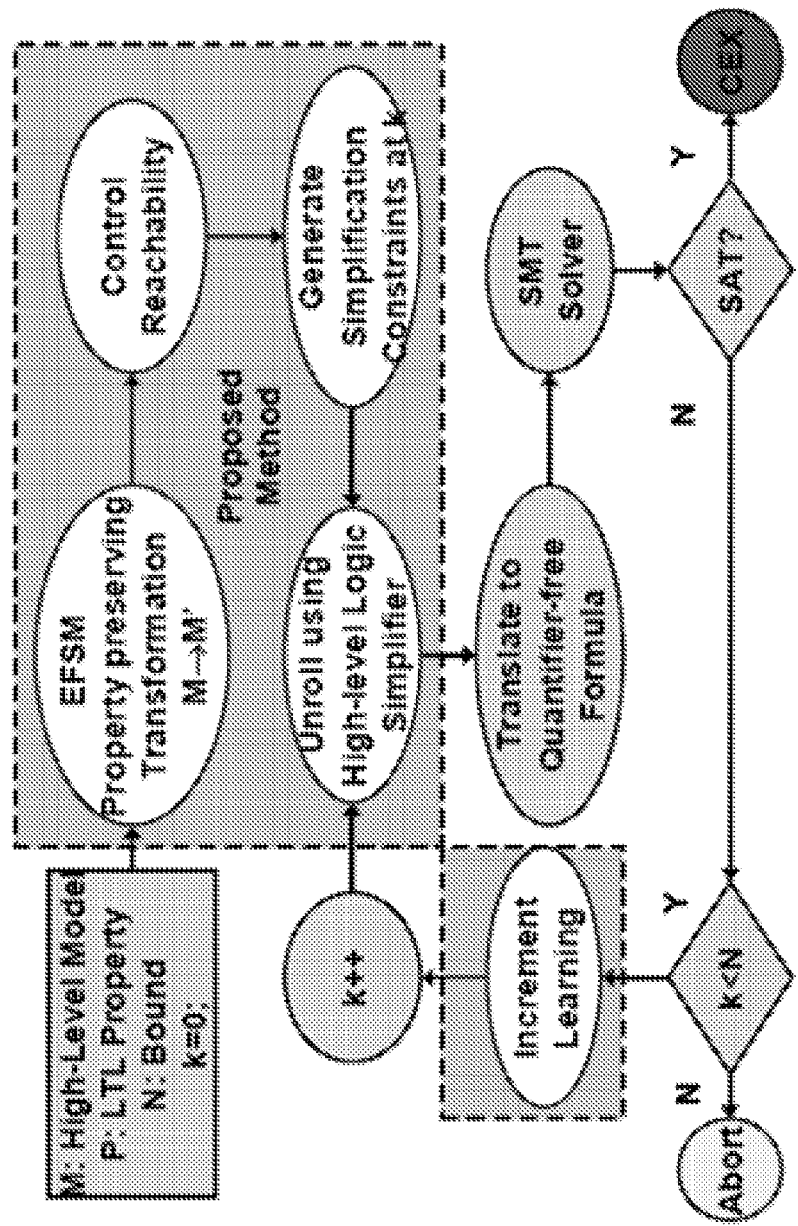
FIG. 1 is a flow diagram depicting accelerated High-Level Bounded Model Checking (BMC) according to the present invention.

The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

Bounded Model Checking

By way of providing some additional background, those skilled in the art will understand that with bounded model checking (hereinafter "BMC") is a model checking technique where falsification of a given Linear Temporal Logic ("LTL") property is checked for a given sequential depth, or bound. Typically, BMC involve three steps namely, 1) A design with property f is unrolled for k (bounded) number of time frames; 2) The BMC problem is translated into a propositional formula $\phi$, such that $\phi$ is satisfiable if and only if the property f has a counter example of a depth (less than or) equal to k; and 3) a SAT-solver is used for the satisfiability check.

Boolean Level BMC

As known by those skilled in the art, with Boolean-level BMC a translated formula is expressed in propositional logic and a Boolean-level SAT solver is used for checking satisfiability of the problem. Fortunately—and indicative of its utility—this technology is well-matured and has garnered widespread adoption. Several sate-of-the art techniques (See., e.g., M. R. Prasad, A. Biere and A. Gupta "A Survey of Recent Advances In SAT-Based Formal Verification," STTT 7(2), 2005) exist for Boolean BMC that have helped its acceptance.

There are however, several recognized limitations associated with prepositional translations and the use of a SAT-based solver. More particularly, Boolean translation in the presence of a large data-path leads to a large formula, which is normally detrimental to a SAT-based solver due to the increased search space. In addition, a large formula also requires a large memory (computer memory) for the representation, which is associated with poor performance of modern computers due—in part—to cache miss penalties.

Another limitation associated with a SAT-based solver is that data-path sizes have to be known before unrolling the transition relation and have to be finite. For an infinite data-path, additional range-analysis of the program design is required to obtain conservative but finite data-path sizes.

A final limitation associated with SAT-based solvers is that high level information gets lost in a Boolean encoding and Boolean-level BMC has to re-discover this information often at a performance cost. Though this high level information can be provided to Boolean level BMC in terms of additional constraints, it often adds overhead to the SAT solver and affects its performance adversely.

High Level BMC

Advantageously, high-level BMC overcomes the above-noted limitations of a Boolean level SAT-based BMC; wherein, a BMC problem is translated into a quantifier-free formula in a decidable subset of first order logic, instead of translating it into a propositional formula. The first order logic formula is then solver by a high-level solver.

It has been shown that an expressive logic called CLU (counter arithmetic logic with lambda-expression and uninterpreted functions) may be used to model systems (See, e.g., R. E. Bryant, et. al., "Modeling and Verifying Systems Using a Logic of Counter Arithmetic with Lambda Expressions and Uninterpreted Functions," CAV, 2002). The decision procedure employed therein is a hybrid one, using either a small model instantiation with conservative ranges or a predicate-based encoding. It generates an equi-satisfiable Boolean formula which is then checked using a Boolean SAT-solver.

As such these approaches employed to overcome all or part of the limitations associated with a Boolean-level SAT-based BMC as discussed disadvantageously cost one or more of the beneficial features associated with Boolean-level BMC.

Extended Finite State Machine (EFSM)

According to an aspect of the present invention, our method extracts high-level information from an Extended Finite State Machine (EFSM) model. As known by those skilled in the art, an EFSM model is a representation of sequential program design with a partitioning of control and datapath. An EFSM has finite logical (control) states and conditionals (guards) on the transitions between the states. The guards in general are a function of control states and/or data-path and/or input variables.

Those skilled in the art will recognize that an EFSM model is a 6-tuple where $\langle s_0, S, I, O, D, T \rangle$ where:

$s_0$ is an initial state;
S is a set of control states;
I is a set of inputs;
O is a set of outputs;
D is a set of state (datapath) variables; and
T is a transition relation $(T_E, T_U)$ where
$T_E$ is an enabling transition relation, $T_E: S \times D \times I \rightarrow S$;
$T_U$ is an update transition relation, $T_U: S \times D \times I \rightarrow D \times O$;

An ordered pair $\langle s, x \rangle \in S \times D$ is called a configuration of M. A transition from a configuration $\langle s, x \rangle$ to $\langle t, y \rangle$ under an input i, with possible output o comprises of two transitions: a) an enabling transition, represented as $((s,x,i),(t)) \in T_E$ and b) an update transition, represented as: $((s,x,i),(y,o)) \in T_U$.

For a given enabling transition $s \rightarrow t$, we define an enabling function $f$ such that $f(x,i)=1$ iff $((s,x,i),(t)) \in T_E$ and we label the transition as $s \rightarrow_{f(x,i)} t$.

For ease of description, we consider deterministic EFSMs where for any two transitions from a state s, i.e., $s \rightarrow_{f(x,i)} t_1$ and $s \rightarrow_{g(x,i)} t_2$, $f(x,i) \wedge g(x,i) =$ FALSE. We also define to(s)= $\{t | s \rightarrow_{f(x,i)} t\}$ as a set of outgoing control states of s. Similarly, we define from(t)=$\{s | (s,t) \in T_E\}$ as a set of incoming control states of t. We define a NOP state as a control state with no update transition and a single outgoing enabling transition. According to the principles of the present invention, a NOP state with n incoming transitions can be replaced with n NOP states, each with a single incoming and a single outgoing transition without changing incoming or outgoing states.

For the purposes of the discussion herein, a NOP state will have only a single incoming/outgoing transition. We define a SINK state as a control state with no update transition relation and no outgoing transition. We define a transition or state as contributing with respect to a variable if it can affect the variable; otherwise such a transition or state is called non-contributing.

EXAMPLE 1

Figure 2:
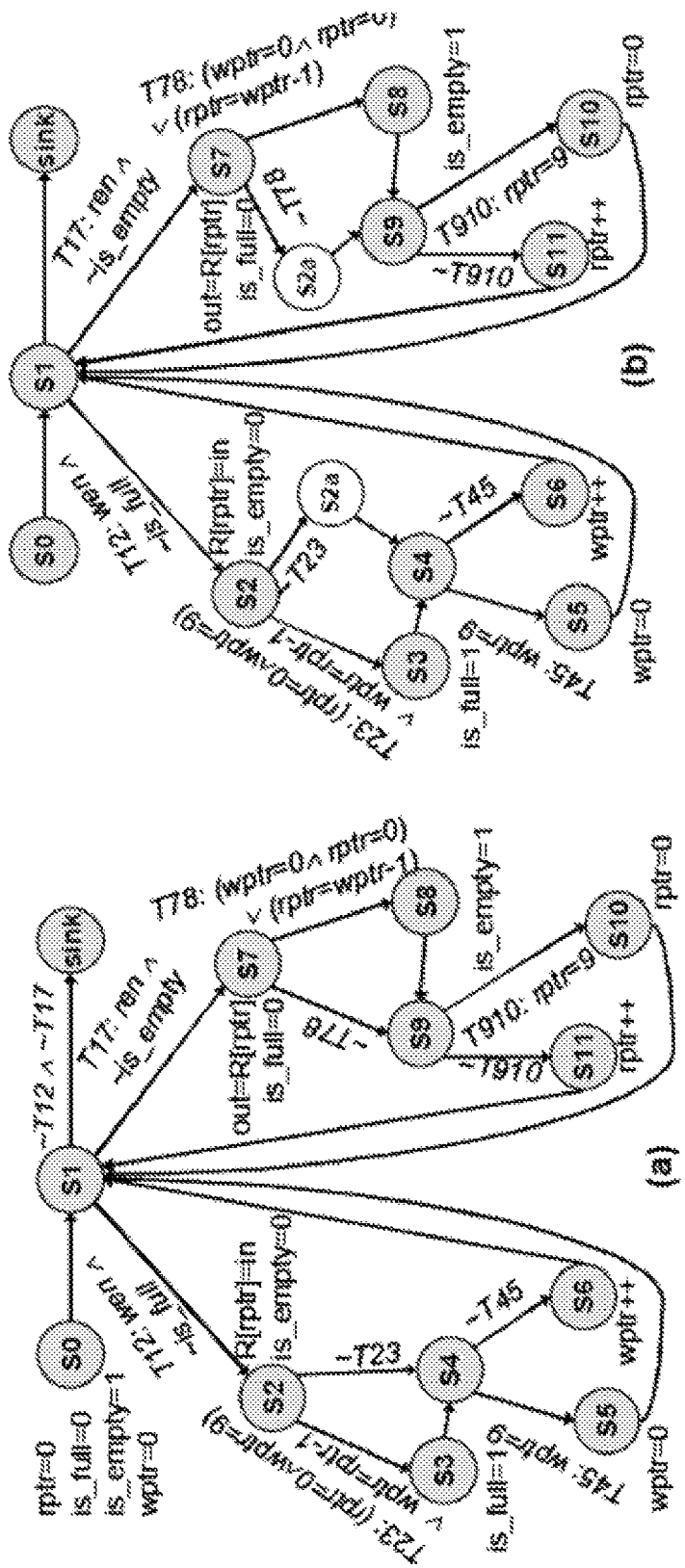
FIG. 2 show state diagrams for Extended State Finite Machine Models for a) original model M, and b) transformed model M'.

We illustrate EFSM model M of a FIFO example (implemented using a RAM) using a State Transition Graph (STG) as shown in FIG. 2(a) where S={S0, ... S11} I={ren,wen, fifo_in}, O={fifo_out,is_full,is_empty}, D={rptr,wptr,is_full,is_empty,RAM[10]}. The enabling functions are shown in italics and update transitions are shown in non-italics in FIG. 2(a). For example, the transition $S2 \rightarrow_{T23} S3$ has enabling function T23=(rptr==wptr−1)||(rptr==0 && wptr==9)) and update transition {RAM[rptr]=in; is_empty=0}.

Flow Graphs

Those skilled in the art will recognize that a flow graph G(V,E,r) is a directed graph with an entry node r. A path from u to v, denoted as p(u,v), is a sequence of nodes $u=s_1, \ldots s_k=v$ such that $(s_i, s_{i+1}) \in E$ for $1 \leq i \leq k$. We denote Path(u,v) as a set of paths between u and v, and the length of a path $p \in$ Path(u, v), is the number of edges in the sequence.

For $p_x, p_y \in$ Path(u,v) $p_x \neq p_y$, if the sequence of states in $p_x$ is different from $p_y$; such paths are called re-converging paths. A concatenation of paths p(t,u) and p(u,v), denoted as $p(t,v)=p(t,u) \oplus p(u,v)$, represents a path from t to v that goes through u. A node n is said to dominate node m denoted as dom(m) if every path from r to m goes through n. As such, the node r dominates every other node in the graph.

A Strongly Connected Component (SCC) $(V_i, E_i)$, is a subgraph of G such that for all $u, v \in V_i$, there exists a path $u=s_1, \ldots s_k=v$ such that $(s_j, s_{j+1}) \in E_i$ for $1 \leq j \leq k$. The SCC $(V_i, E_i, r_i)$ is a loop with entry $r_i$ if $r_i$ dominates all the nodes in $V_i$. An edge (u,v) is called a back-edge if v dominates u; otherwise it is called a forward-edge. Given a back-edge (u,v) a natural loop of the edge is defined as the set of nodes (including u) that can reach u without going through v.

For a given G(V,E,r), and any pair of natural loops, $L_1=(V_1, E_1, r_1)$ and $L_2=(V_2, E_2, r_2)$ one of the following cases holds: 1) they are disjoint i.e., $V_1 \cap V_2 = \phi$; 2) they are disjoint but have the same entry node i.e., $V_1 \cap V_2 = \{r_1\} = \{r_2\}$; or 3) one is completely nested in the other, i.e., $V_1 \subseteq V_2$ or $V_2 \subseteq V_1$. Finally, a sink node is a node with no outgoing edge.

A flow graph G(V,E,r) is reducible if and only if E can be partitioned into disjoint set front-edge set $E^f$ and back-edge set $E^b$ such that $G^d(V, E^f, r)$ forms a direct-acyclic graph (DAG) where each $v \in V$ can be reached from the entry node r. The reducible graph has the property that there is no jump into the middle of the loops from outside and there is only one entry node per loop. As can be appreciated, most flow graphs that occur frequently fall into the class of reducible flow graphs.

The use of structured control flow statements such as if-then-else, while-do, continue, and break produce programs whose flow graphs are always reducible. Unstructured programs due to the use of goto can cause irreducibility of the graphs. Thus focusing on a reducible graph is not a significant restriction of our method and techniques, and advantageously is in accordance with practical guidelines.

For a given EFSM $<s_0,S,I,O,D,T>$, let $G=(v,E,r)$ be a flow graph with start vertex r, such that V=S, E={(s,t)|s→t}, and $r=s_0$. The sets to(s) and from(s) represent the set of outgoing nodes and incoming nodes of a node s, respectively. A reachability analysis on a flow graph corresponds to control state reachability (CSR) analysis of the corresponding EFSM.

High-Level BMC

FIG. 1 depicts a flow diagram of accelerated high-level BMC according to an aspect of the present invention. More particularly, given an EFSM Model M and a property P, we perform a series of property preserving transformations. Next, we perform a control state reachability analysis on the transformed model. Using the reachability information obtained from the reachability analysis, we next generate novel simplification constraints on-the-fly at each unroll depth k. As will be shown, these simplification constraints are used by an expression simplifier during unrolling to reduce the formula. In addition, these constraints are used to improve the search on the translated problem. Finally, an incremental learning technique may be employed i.e., reuse of theory lemmas in high-level BMC framework.

Expression Simplifier

High-level expressions—according to the present invention—include Boolean expressions bool-expr and term expressions term-expr. Boolean expressions are used to express Boolean values as true or false, Boolean variables (bool-var), propositional connectives (∨,∧¬), relational operators (<,>,≧,≦,==) between term expressions, and uninterpreted predicates (UP). Term expressions are used to express integer values (integer-const) and real values (real-const), integer values (integer-var) and real variables (real-vars), linear arithmetic with addition (+) and multiplication (*) with integer-const and real-const, uninterpreted functions (UF), if-then-else (ITE), and read and write to model memories. To model behavior of a sequential system, we employ a next operator to express the next state behavior of the state variables.

Our high-level design description is represented in a semi-canonical form using an expression simplifier. The simplifier rewrites expressions using local and recursive transformations in order to remove structural and multi-level functionality redundant expressions, similar to simplifications proposed for Boolean logic, and also for first order logic. Our expression simplifier has a "compose" operator that can be applied to unroll a high-level transition relation and obtain on-the-fly expression simplification; thereby achieving simplification not only within each time frame but also across time frames during unrolling of the transition relation in BMC.

Incremental Learning in High-Level BMC

Learning from overlapping instances of prepositional formulas has been proposed (See, e.g., O. Strichman, "Pruning Techniques for SAT-Based Bounded Model Checking," Proceedings of TACAS, 2001; M. Ganai and A. Aziz, "Improved SAT-Based Bounded Reachability Analysis," Proceedings of VLSI Design Conference, 2002; and J. Whittemore, J. Kim and K. Sakallah, "SATIRE: A New Incremental Satisfiability Engine," Proceedings of DAC, 2001) and found to be useful in Boolean SAT-based BMC (See, e.g., M. Ganai, A. Gupta, and P. Ashar, "DiVer: SAT-Based Model Checking Platform for Verifying Large Scale Systems, Proceedings of TACAS, 2005; and M. Ganai, A. Gupta, and P. Ashar, "Beyond Safety: Customized SAT-based Model Checking", Proceedings of DAC, 2005). We use incremental learning of theory lemmas across time-frames, and advantageously have found this technique to be—according to the present invention—beneficial in the context of high-level BMC.

Property-Based ESFM Reduction

According to an aspect of the present invention, our method performs slicing on ESFM with respect to variables of interest as defined by the property and obtains contributing and non-contributing states and transitions. Advantageously, slicing away behaviors (and the elements) unrelated to the specific properties can significantly reduce the model size and thereby improve the verification effort. According to the present invention, two such techniques are described namely, cone-of-influence (COI) and reduction and collapsing.

Cone-of-Influence Reduction

In performing COI reduction, we first remove all non-contributing states and their outgoing transitions. Additionally, any non-contributing transitions $s \rightarrow_{f(x,i)} t$ where s is a contributing state, is replaced by a transition $s \rightarrow_{f(x,i)} SINK$. Furthermore, if we are concerned with the reachability of a state $s \in S$ from a start state $s_0$, then we remove the outgoing transition from s since it is non-contributing for the shortest counter-example or proof. For example, the self-loop translation S1→S1 (not specifically shown in FIG. 2(a)) is non-contributing and hence is replaced by S1→SINK as depicted in FIG. 2(a).

Collapsing

We define a collapsing condition as that when all states in to(s) are NOP and none of them directly appears in a reachability check. Under such a condition, we collapse all of the NOP states and merge them with s. In other words, ∀t∈to(s), (with t being NOP), we remove the transitions $s \rightarrow_{f(x,i)} t$ and $t \rightarrow_{TRUE} q$ and add a new transition $s \rightarrow_{f(x,i)} q$.

Extraction: Control State Reachability (CSR)

We may now discuss extraction of high-level control-flow information of the design/program which is subsequently used to simplify the unrolled formula—which we shall describe later.

Starting from an initial state S0 we compute control state reachability (CSR) using a breadth first search (BFS). A control state $S_i$ is one step reachable from $S_j$ if and only if there exists an enabling transition between them. At a given sequential depth d, let R(d) represent the set of control states that can be reached statically on one step from the states R(d−1) with R(0)={S0}. Note that we are not computing the fixed-point diameter.

For some d, if R(d−1)≠R(d)=R(d+1), we say the CSR saturates at depth d and stop; otherwise we compute R(d) and |R(d)| i.e., size of R(d) up to the BMC bound. Note, CSR information is static information without considering the enabling functions, i.e., if a control state is not reachable from the initial state in CSR, it is definitely not reachable in the model, however, the other way is not true in general. Applying CSR on the FIFO of example 1, we obtain the set R(d) as shown in Table 1(a). Note that the saturation depth is 15, |R(15)|=|R(16)|=11 where R(15)={S1, S2, ... S11}

On-The-Fly Simplification and Learning

For n control states S1 ... Sn we introduce n Boolean variables $B_{S1} \ldots B_{Sn}$. If we let the Boolean variable $B_r$=TRUE if and only if configuration of M is (r,x) for some x∈V. Equivalently, $B_r$ corresponds to a predicate on the control state variable, called the PC (Program Counter) i.e., $B_r$≡(PC==r). Let $B_r^d$ denote the Boolean variable $B_r$ at depth d during BMC unrolling.

At any unrolling depth d of high-level BMC, we apply the following on-the-fly structural and clausal (learning based) simplification on the corresponding formula. Note, these simplifications are effective for small |R(d)|. We use a procedure we call Simplify(BoolExpr e, Boolean v) which constrains a Boolean expression e to a Boolean value v, and also reduces the expressions that use e. Later, we will illustrate this with an example.

1. Unreachable Block Constraint (UBC)

$\forall_{r \notin R(d)}$Simplify($B_r^d$,0) Since the state r is not reachable at depth d, the predicate $B_r$ will evaluate to FALSE at depth d. Therefore, simplifying the formula by propagating $B_r$=0 at depth d preserves the behavior of the design.

2. Reachable Block Constraint (RBC)

Simplify($V_{r \in R(d)} B_r^d$,1) At any depth d, at least one state in R(d) is reachable.

3. Mutual Exclusion Constraint (MEC)

$\forall_{r,i \in R(d), r \neq t}$Simplify(($B_r^d \Rightarrow \neg B_t^d$),1) At any depth d, at most one state in R(d) is the current state.

4. Forward Reachable Block Constraint (FRBC)

$\forall_{r \in R(d)}$Simplify(($B_r^d \Rightarrow v_{s \in to(r)} B_s^{d+1}$),1) At any depth d, if the current state is r i.e., $B_r^d$=TRUE then the next state must be among the to(r) set.

5. Backward Reachable Block Constraint (BRBC)

$\forall_{r \in R(d)}$Simplify(($B_r^d \Rightarrow v_{s \in from(r)} B_s^{d-1}$),1) At any depth d, if the current state is r i.e., $B_r^d$=TRUE, then the previous state at depth d−1 must be among the from(r) set.

Block-Specific Invariant (BSI)

$\forall_{r \in R(d)}$Simplify(($B_r^d \Rightarrow C_r^d$),1) At any depth d, a given invariant $C_r$ for a given state r is valid only if r is the current state at depth d.

Importantly, certain prior attempts (See., e.g., F. Ivanic, J. Yang, M. Ganai, A. Gupta and P. Ashar, "Efficient SAT-based Bounded Model Checking for Software" Proceedings o ISOLA, 2004) added some of these constraints in the transition relation so as to include them in the formula at each unrolling. In sharp contrast, the present invention adds only the relevant constraints at any unrolling thereby reducing the overall formula size. Therefore, we would prefer a smaller set R(d) to increase the effectiveness of our simplification. Later we discuss how we transform EFSM model to reduce the set R(d).

Example 1 We may now illustrate simplification constraints at depth d=4. In particular, we consider the effect of simplification on the unrolled expression for variable is_full. The transition relation for the state variable is_full is defined as follows next(is_full)=($B_{S0}$||$B_{S7}$)?0:($B_{S3}$)?1:is_full The high level expression for the unrolled variable, corresponding to next(is_full) at depth 5 would be:

is_full$^5$=($B_{S0}^4$||$B_{S7}^4$)?0:($B_{S3}^4$)?1:is_full$^4$

For the sake of brevity, we describe only the Unreachable Block Constraint. Note that at d=4 only S4, S5, S6, S9, S10 and S11 are reachable (See, e.g., Table 1(a)) Accordingly, $\forall_{r \in \{S0,S1,S2,S3,S7,S8\}}$Simplify($B_r^4$,0)

Using this simplification, the expression for is_full$^5$ is mapped to an existing variable is_full$^4$, thereby reducing the additional logic, i.e., is_full$^5$=is_full$^4$.

EFSM Transformation: Balancing Re-Convergence

As can be appreciated, the efficiency of on-the-fly simplification depends on he size of the set R(d) i.e., |R(d)|. A larger |R(d)| reduces the scope of simplification at depth d and hence the performance of high-level BMC. Re-converging paths of different lengths inside loops is one of the reasons for the saturation of reachability and inclusion of all looping control states in the set R. To improve the performance of high-level BMC further, we advantageously adopt a strategy called "Balancing Re-convergence" that transforms the original model into a "BMC friendly" model but preserves the validity of the model with respect to the property expressed in LTL\X (Linear Temporal Logic Without the next-time operator).

Strategy: Intuition

For balancing re-convergence and reducing the set R(d) and thereby improving the scope for simplification of high-level BMC, we transform an ESFM by inserting NOP states such that the lengths of the re-convergence paths are the same and control state reachability does not saturate. Reduction in R(d) in general, improves the scope of on-the-fly simplifications. Note that the additional NOP states have little effect on simplification, although they increase the total number of control states and transitions, and possibly the search depth. As NOP states do not add complexity to the transition relations of any state variables except the program variables encoding the control states, the Unreachable Block Constraint simplification at depth d is practically unaffected by inclusion of such states in R(d). Also, the Forward and Backward Block Constraint simplifications are not affected, as these additional transitions are single outgoing transitions (and therefore always enabled) from NOP states.

We define R$^-$(d)={s|s∈R(d) and s is not a NOP state}. We use max$_d$|R$^-$(d)| to measure the effectiveness of our strategy in improving the scope of simplification of high-level BMC. Note that the above transformation preserves LTL\X properties, as NOP states can only increase the length of traces but not the eventuality and global behavior. As the state of data variables does not change in an NOP state, the validity of atomic propositions is not affected.

EXAMPLE 1 (CONT)

For the EFSM model shown in FIG. 2(a), paths S2→S3→S4 and S2→S4 are re-converging with different lengths. For balancing, we insert a NOP state S2a such that transition S2→$_{~T23}$S4 is replaced by S2→$_{~T23}$S2a→$_{TRUE}$S4. Similarly, as paths S7→S8→S9 and S7→S9 are re-converging with different lengths, we insert another NOP state S7a and replace the transition S7$_{~T78}$S7a→$_{TRUE}$S9. The modified EFSM model M' is shown diagrammatically in FIG. 2(b). CSR on M' is shown in Table 1(b). Note that at depth max$_d$ R$^-$(d)=4. Also CSR on M' does not saturate.

Balancing Re-Convergence without Loops

Consider the DAG, G(V,E$^f$,r) corresponding to the reducible flow graph G(V,E,r) with an entry node r and front-edge set E$^f$. Let w(e) denote the weight of the edge, e=(a,b)∈E$^f$. As we will later see, the weight of the edge (a,b) corresponds to one more than the number of NOP states that need to be inserted between nodes a and b. We define weight for a path $p=\langle S_1 \ldots S_k \rangle$, denoted as $w(p)=\Sigma_{1 \leq i \leq k}w(e_i)$ where $e_i=(s_i,s_{i+1})\in E^f$. We may now define the problem as follows.

Problem 1: For a given DAG $G(V,E^f,r)$ find a weight function $w:E^f \to Z$ such that $\forall p_x,p_y \in P(u,v) w(p_x)$, where $u,v \in V$. Note that if we are able to find a feasible w, then the number of NOP states introduced for an edge, $e=(a,b)\in E^f$ will be equal to $w(e)-1$. We say that the set $P(u,v)$ is balanced when all the paths from u to v have equal weights, i.e., $\forall p_x,p_y \in P(u,v), w(p_x)=w(p_y)$.

Let $W(u)$ denote the weight of the paths in the balanced set $P(r,u)$ with $W(r)=0$.

Lemma 1: If $P(r,v)$ is balanced and $P(u,v) \neq \phi$, then $P(u,v)$ is balanced.

Proof: We may prove by contradiction, in particular Let $p_1(r,u) \in P(r,u)$ and assume that $P(u,v)$ is not balanced, i.e., there exists at least two paths $p_1(u,v) \in P(u,v)$ and $p_2(u,v) \in P(u,v)$ such that $w(p_1) \neq w(p_2)$. Let $p_0(u,v) \in P(u,v)$. The weight of the concatenated path $p_0 \oplus p_2$ is $w(p_0)+w(p_1)$ and that $p_0 \oplus p_2$ is $w(p_0)+w(p_2)$. Since $w(p_1) \neq w(p_2)$, the weight of the concatenated paths are different, however since $p_0 \oplus p_2$, $p_0 \oplus p_2 \in P(r,v)$ is balanced, we get a contradiction. Thus, $P(u,v)$ is also balanced.

Using Lemma 1 we reformulate the problem as follows. In particular, problem 1 may be stated differently as: Given a DAG $G(V,E^f,r)$ find a weight function $w:E^f \to Z$ and $w:V \to Z$ such that $P(r,v)$ is balanced i.e., $w(p_x)=w(p_y)=W(v), \forall p_x,p_y \in P(r,v)$.

Solution: If $P(r,u)$ is balanced $\forall u \in from(v)$, i.e., $W(u)$ is computed, we can balance $P(r,v)$ recursively as follows.

$$\forall_{u \in from(v)} w(u,v)=t-W(u)$$

where $t=(\max_{u \in from(v)} W(u))+1$. Set $W(v)=t$ as for any path $p(r,v)$ through u will have weight $W(u)+w(u,v)=W(u)+t-W(u)=t$.

We may start with an initial set of nodes S which are sink nodes in $G(V,E^f,r)$. Then, we recursively apply the above steps in the procedure BalancePath as shown in FIG. 3. Termination is guaranteed as the recursive sub-procedure BalanceAux is invoked only once per node. The correctness of the algorithm may also be shown through the use of an inductive argument.

Collapsing NOP States

As previously discussed, according to the present invention we insert NOP states corresponding to the edge weights obtained after executing BalancePath. For an edge $e=(u,v)$, we insert $(w(e)-1)$ NOP states. As can be readily appreciated by those skilled in the art, the method of BalancePath adds/inserts a minimum number of NOP states when balancing paths. However, the inserted NOP states together with NOP states in the original FESM may generate a collapsing condition discussed earlier. In that case, we collapse the NOP states as also discussed earlier. We then re-run BalancePath as the lengths of the re-converging paths may have changed due to the collapsing. Note that the collapsing may be integrated with the procedure BalancePath thereby avoiding re-running the procedure.

Balancing Re-Convergence with Loops

Since the flow graph $G(V,E,r)$ is reducible, we know that every loop $L_i=G(V_i,L_i,r_i)$ is a natural loop corresponding to back-edge set $(b_i,r_i) \in E^b$ and has a single entry node $r_i$. As can be understood, the presence of back-edges in loops and their relative skews cause re-convergence paths of different lengths, which in turn can also lead to saturation during control reachability analysis. Accordingly, we say that a loop $L_i$ is saturated at depth s when $\forall v \in v_i, v \in R(t)$ for $t \geq s$. Given balanced Path $(r_i b_i)$ for each loop $L_i$, we define forward loop length, $C_i$, for loop $L_i$ as follows:

$$C_i=W(b_i)-W(r_i)$$

Where $W:V \to Z$ is the weight function we obtain for each node in $G(V,E^f,r)$ using the BalancePath procedure described earlier and shown in FIG. 3. Observe that then entry node j; of loop $L_i$ reappears in control reachability after $N_i=C_i+w(b_i,r_i)$ steps i.e., $r_i \in R(d_i+n_iN_i)$ where $d_i,N_i \in Z$. We call $N_i$ the loop period of $L_i$.

If there is only one loop, it is relatively easy to see that $d_i=W(r_i)$. However when there are multiple loops, one must account for the paths from other loops to loop $L_i$. More particularly, if there is a path from entry node $r_j$ of some loop $L_j$ to $r_i$, then entry $r_i$ also re-appears after $N_j$.

We define loop clusters LC as sets of disjoint entry nodes such that for any two clusters $LC_x$ and $LC_y, \forall s \in LC_x, \forall t \in LC_y$, $P(s,t)=P(t,s)=\Phi$. Note that a loop in a cluster does not affect the loop in another cluster as far as reachability is concerned. In the following problem statement, we discuss how to prevent loop saturation using suitable transformations.

Problem 2: Given a reducible flow graph $G(V,E,r)$ with $E=E^f \cup E^b$, find $w:E^b \to Z$ and $N_i$ so that loop $L_i$ is not saturated.

Solution: We define a set $from(i)=\{j|r_j=r_i \text{ or } Path(r_j,r_i) \neq \phi\}$. Therefore, $d_i=W(r_i)+\Sigma_{j \in from(i)} n_j N_j$ where $n_j \in Z$. We define $D_i=\min_{k \in from(i) \cup \{i\}} N_k$. It is relatively straightforward to see that a loop $L_i$ gets saturated at depth $t+D_i$ during reachability if $r_i \in R(t+k) \forall k, 0 \leq k \leq D_i$. This is captured by the following integer linear equations in terms of s and $n_j$'s forgiven $N_j$'s, $N_i$, and $W(r_i)$, in particular:

$$W(r_i)+\Sigma_{j \in from(i)} n_j N_j+n_i N_i=s$$

$$W(r_i)+\Sigma_{j \in from(i)} n_j N_j+n_i N_i=s+1$$

$$\ldots$$

$$W(r_i)+\Sigma_{j \in from(i)} n_j N_j+n_i N_i=s+D_i-1$$

To prevent saturation of loop $L_i$, we need to find $N_j$'s and $N_i$ such that there is no feasible solution to the above equations. One strategy is to choose a weight function $w:E^b \to Z$ such that the loop lengths match, i.e., $N_i=N_j \forall j \in from(i)$. As can be readily appreciated, one can verify the infeasibility for this solution assuming that each loop has at least two nodes, i.e., $N_i \geq 2$.

We consider one loop cluster at a time. We define maximum loop period over all loops in the cluster (i.e., those whose entry nodes are in the cluster) $N=(\max_i C_i)+1$. We assign a weight to each back-edge $(b_i,r_i)$ as follows:

$$w(b_i,r_i)=N-C_i;$$

For each loop $L_i$ in the cluster, the entry node $r_i \in R(W(r_i)+nN)$ where $n \in Z$. Thus, the upper bound on $|R(d)|$ for $G(V,E,r)$ at any depth $d \gg 1$, $|R(d)| \leq \Sigma_i \max_t |R_i(t)|$, where $R_i(t)$ is the control reachability set (including NOP states) on loop $L_i$ at depth t. Similarly, the upper bound on $|R^-(d)|$ for $G(V,E,r)$ at any depth $d \gg 1$, is $|R^-(d)| \leq \Sigma_i \max_t |R_i^-(t)|$, where $R^-(t)$ is the control reachability set (of only non-NOP states) on loop $L_i$ at depth t.

EXAMPLE 2

We now illustrate our method for balancing flow graph using an example shown in FIG. 4(a). Let $v_i$ represent the node with index i (shown inside the circle). Note that the flow graph $G(V,E,v_i)$ has three natural loops $L_1$, $L_2$ and $L_3$ corresponding to the back-edges $(v_6,v_3),(v_7,v_1)$, and $(v_8,v_3)$ respectively. The corresponding entry nodes for the loops are $v_3$, $v_1$, and $v_3$ respectively. Note, they all form a cluster. The DAG $G(V,E^f,v_i)$ corresponding to the front-edge set, $E^f=E-\{(v_6,v_3),(v_7,v_1),(v_8,v_3)\}$ is shown in FIG. 4(b). After executing BalancePath, we obtain edge weights, also shown in FIG. 4(b), that balance all re-convergence paths in $E^f$. Note that the edge with no weight shown has an implicit weight of 1. Also, shown are the W values of each node. For instance, $W(v_6)=5$ denotes that all the paths in the set $P(v_1,v_6)$ have weights equal to 5.

Next, we compute the forward loop length of each loop and the weights of the back-edges. The forward loop length of loop with back-edge $(v_6v_3)$ is $W(v_6)-W(v_3)=3$; similarly, with back-edge $(v_7v_1)$ is 6, and with back-edge $(v_8v_3)$ is 5. Thus, the value of N as defined, is 7. The weight of the back-edges $(v_6,v_3)$, $(v_7,v_1)$ and $(v_8,v_3)$ are 4, 1, and 2 respectively as shown in FIG. 4(c). For each edge with weight w, we insert w−1 nodes corresponding to NOP states as shown as un-shaded circles in the modified flow graph in FIG. 4(d).

Reachability on the original flow graph $G(V,E,v_1)$ shown in FIG. 4(a) saturates at depth 6 with 8 nodes. The reachability on the balanced flow graph in FIG. 4(d) does not saturate. Instead, the set of reachable nodes R(d) at depth d shows a periodic behavior with period, N=7. If we do a reachability analysis separately on each loop of the modified flow graph in FIG. 4(d), we obtain $\max_t|R_1(t)|=2$, $\max_t|R_2(t)|=2$, and $\max_t|R_3(t)|=2$. Thus the upper bound on $|R(t)|$ is 6. Similarly, $\max_t|R^-_1(t)|=1$, $\max_t|R^-_2(t)|=1$, and $\max_t|R^-_3(t)|=1$ and upper bound on $\max_t|R^-(t)|$ is 3. In this case $\max_t|R^-(t)|=4$ and $\max_t|R^-(t)|=2$. Clearly, the scope of simplification during BMC is significantly improved.

Experimental Evaluation of High-Level BMC

Our inventive method was evaluated on a public benchmark bc-1.06, a C-program for an arbitrary precision calculator language with interactive execution of statements. This program has a known array bound access bug (checked as an error-label reachability property). Using the known program verification tool F-soft, we first generated an ESFM model M with 36 control states and 24 state variables. The data path elements include 10 adders, 106 if-then-else, 52 constant multipliers, 11 inequalities, and 49 equalities. The corresponding flow graph has two loops, with 4 and 8 nodes (control states) respectively. We also used statically generated invariants to provide block specific invariants.

We have performed controlled experiments to evaluate the role of various accelerators discussed in improving the performance of high-level BMC. In doing so, we employed the difference logic solver—SLICE—in the backend. We modified the solver to support incremental learning across time frames and translated conservatively each BMC problem instance into a difference logic problem. (A precise translation would have been to a UTVPI—Unit Two Variables Per Inequality—problem). To understand the effectiveness of our methods, a conservative translation suffices as long as we do not get false negatives, which advantageously was not an issue for this example.

Table 2 shows the results of our experiments run on three EFSM models M, M', and M". Model M is the original model without any proposed transformations. Model M' is the model obtained from M using the procedure described earlier namely, Balancing Re-Convergence With Loops.

Column 1 of Table 2 shows the loop sizes in each of the models for loops $L_1$, and $L_2$; the number of control states (including inserted NOP states); the results of control reachability on each of the models i.e., either saturation depth or max loop period N; maximum size of the reachable set of control states overall depth $R_{max}=\max_d R(d)$; and maximum size of the reachable set of non-NOP control states overall depth $R_{max}=\max_d R(d)$.

Column 2 of Table 2 presents various learning and simplification strategies denoted as follows: A for Expression Simplification (ES), B for Incremental Learning (IL) combined with B,D for Reachable Block Constraint (RBC) combined with C,E, for Forward Reachable Block Constraint (FRBC) combined with D, F, for Backward Reachable Block Constraint (BRBC) combined with E, and G for Block Specific Invariants combined with F. Column 3 shows the number of calls (#HS) made to the high-level solver when the expression simplifier cannot reduce the problem to a tautology.

Column 4 shows the depth D reached by high-level BMC under a given time limit ("*" denotes time out). Column 5 shows the time taken (in seconds) to find the witness; TO denotes that time out occurred. Column 6 shows whether a witness was found in the given time limit—if so the witness length is equal to D.

Discussion

Note that fewer calls (#HS) made to the SMT solver directly translates into performance improvement as the expression simplifier structurally solves the remaining D-#HS SMT problems more efficiently. We now discuss the effect of various learning scheme in improving the structural simplifications. As can be seen, CSR on Model M saturates at depth 13 with 36 control states. Although Unreachable Block Constraint (UBC) allows deeper search with fewer solver calls, the simplification scope is very limited due to the large set R(d). This also prevents other simplification strategies from being useful. As shown in Column 6, none of the strategies is able to find the witness in the given time limit. When we apply the procedure BalancePath with the procedure collapsing of NOP states on Model M, we obtain a model with M' with 34 control states with reduced loop size $|L_2|$.

As can be appreciated, CSR on M' does not saturate and has $\max_d R(d)=4$ and $\max_d R^-(d)=3$. This increases the scope of simplification significantly. As shown in Column 6, all simplifications strategies C-G are able to fined the witness in the given time limit. Except for FRBC, all simplification strategies seem useful in reducing the search time; although only UBC can reduce the number of calls to the high-level solver as shown in Column 3. Block Specific invariants added on-the-fly are also found to be useful. Note, although strategy B with only incremental learning does not find the witness, it still helps to search deeper compared to strategy A.

By applying our loop balancing procedure on the model M', we obtain a model M" with matching loop lengths of 6 and total number of control states of 36. We added two NOP-states in the back-edge of loop $L_1$ to get a loop length of 6. Control reachability on M" has $\max_d R(d)=3$ and $\max_d R^-(d)=2$, further increasing the scope of simplification as indicated by a decreased number of calls to the high-level solver. Those skilled in the art will recognize that this is indicated by the reduced solve time (=19 s) using strategy F, although there is a small performance degradation with strategy G. Not surprisingly, the witness length has gone up to 205. Overall, we see progressive and cumulative improvements with various learning techniques and strategies.

Comparison with Boolean-Level BMC

To compare our inventive techniques with Boolean-level BMC, we used our state of the art Boolean-level BMC framework DiVer on a Boolean translation of the model M (with 654 latches, 6K gates) to witness the bug, and used an identical experimental setup as discussed. Note that we added high-level information such as mutual exclusion constraint and backward reachable block constraints in the transition relation beforehand. Thus, all these constraints get included in every unrolled BMC instance automatically, in sharp contrast to the method of the instant invention. The Boolean-level BMC is able to find a witness at depth 143 in 723 s. Not surprisingly, the number of instances solved by structural simplification is merely 15, while 128 calls are made to the SAT-solver. Thus a reduced scope of simplification can greatly affect the performance of BMC, further the case for synthesizing "BMC friendly" models.

Experiments with Industry Software

We also experimented on industry software written in "C" having about 17K lines of code. To perform the experimentation, we first generated an EFSM model M with 259 control states and 149 state (term) variables. The data path elements include 45 adders, 987 if-then-else, 394 constant multipliers, 53 inequalities, 501 equalities and 36 un-interpreted functions. The corresponding flow graph has 12 natural loops.

We consider reachability properties P1-P6 corresponding to six control states. CSR on M saturates at depth 84. After transforming M using path and loop balancing algorithms, we obtain a model M" with 439 control states and max loop period N=4. Using a similar experimental setup (discussed earlier), we ran high-level BMC (HBMC) for 500 s on each of P1-P6 on: (I) Model M with strategy A (using only expression simplification), (II) Model M using strategy F (all simplifications), and (III) transformed Model M" using F. We present our results in Table 3. Column 1 gives the property checked; Column 2-4 give BMC depth reached (* denotes depth at time out, TO), time taken (in sec) and whether witness was found (Y/N) respectively for combination (I). Similarly, Columns 5-7 and 8-10 present information for combinations (II) and (III) respectively. The results clearly show that combination (III) is superior to (II)

At this point, while we have discussed and described our invention using some specific examples, those skilled in the art will recognize that our teachings are not so limited. Accordingly, our invention should be only limited by the scope of the claims attached hereto.

TABLE 1(a-b)

| (a) Model M | | | (b) Model M' | | | |
|---|---|---|---|---|---|---|
| d | R(d) | \|R(d)\| | d | R(d) | \|R(d)\| | \|R(d)\| |
| 0 | S0 | 1 | 0 | S0 | 1 | 1 |
| 1 | S1 | 1 | 1 | S1 | 1 | 1 |
| 2 | S2, S7 | 2 | 2 | S2, S7 | 2 | 2 |
| 3 | S3, S4, S8, S9 | 4 | 3 | S3, S2a, S8, S7a | 4 | 2 |
| 4 | S4, S5, S6, S9, S10, S11 | 6 | 4 | S4, S9 | 2 | 2 |
| 5 | S5, S6, S10, S11, S1 | 5 | 5 | S5, S6, S10, S11 | 4 | 4 |
| ... | ... | | 6 | S1 | 1 | 1 |
| 15 | Saturates with 11 states | | i | Repeats, R(i)=R(i%5) | | |

TABLE 2

| Model | Strategy | #HS | D | sec | W? |
|---|---|---|---|---|---|
| Original M | A: ES | 16 | 17* | TO | N |
| $\|L_1\| = 4, \|L_2\| = 8$, | B: A + IL | 26 | 27* | TO | N |
| #ctrl state = 36 | C: B + UBC | 41 | 64* | TO | N |
| $R_{max} = 36, R''_{max} = 33$ | D: C + RBC | 26 | 49* | TO | N |
| Saturation at d = 13 | E: D + FRBC | 26 | 49* | TO | N |
| | F: E + BRBC | 28 | 51* | TO | N |
| | G: F + BSI | 28 | 51* | TO | N |
| M': M + Balanced Non-Loop | B | 28 | 29* | TO | N |
| path + collapsed NOP states | C | 62 | 143 | 426 | Y |
| $\|L_1\| = 4, \|L_2\| = 6$, | D | 62 | 143 | 159 | Y |
| #ctrl state = 34 | E | 62 | 143 | 159 | Y |
| $R_{max} = 4, R''_{max} = 3$, | F | 62 | 143 | 120 | Y |
| Max loop period, N = 6 | G | 62 | 143 | 65 | Y |
| M": M' + Loop Balanced | F | 32 | 205 | 19 | Y |
| $\|L_1\| = 6, \|L_2\| = 6$, | G | 32 | 205 | 22 | Y |
| #ctrl state = 36 | | | | | |
| $R_{max} = 3, R''_{max}(d) = 2, N = 6$ | | | | | |

TABLE 3

| | I: Strategy A on M | | | II: Strategy F on M | | | III: Strategy F on M" | | |
|---|---|---|---|---|---|---|---|---|---|
| P | D | sec | W? | D | sec | W? | D | sec | W? |
| P1 | 9* | TO | N | 38* | TO | N | 41 | <1 | Y |
| P2 | 9* | TO | N | 41* | TO | N | 44 | <1 | Y |
| P3 | 9* | TO | N | 43* | TO | N | 92 | 156 | Y |
| P4 | 9* | TO | N | 30 | 188 | Y | 94 | 151 | Y |
| P5 | 9* | TO | N | 21 | 6 | Y | 60 | 4 | Y |
| P6 | 9* | TO | N | 31 | 164 | Y | 70 | 22 | Y |

The invention claimed is:

1. A computer-implemented method for verifying the correctness of a software program comprising steps of:

by using a computer generating a sequential model of the software program, said sequential model having a number of reachable control states and data states;

balancing reconvergent control paths in the sequential model by inserting control states with no data operations in said control paths, wherein balancing comprises matching the number of control states in the respective control paths, generating a transformed model from the sequential model of the software program with one or more balanced reconvergent control paths such that the transformed model has fewer reachable control states for at least one depth, while preserving the correctness property and the total number of reachable control states;

determining statically, for the transformed model, which one(s) of its control states are reachable at each depth of the model;

performing a bounded model checking (BMC) verification on the sequential model using the statically determined control state information as constraints to the BMC;

determining a correctness property of the sequential model; and outputting an indication of that correctness determination.

2. The computer-implemented method of claim 1 wherein said BMC constraints include a reachable block constraint in which the sequential model includes at a given depth only those control states which are reachable.

3. The computer-implemented method of claim 1 wherein said BMC constraints include a mutual exclusion constraint in which the sequential model includes at a given depth only one reachable control state.

4. The computer-implemented method of claim 1 wherein said BMC constraints include a forward reachable block constraint in which the sequential model includes at a given depth only those reachable control states which are associated with a reachable control state at a greater depth.

5. The computer-implemented method of claim 1 wherein said BMC constraints include a backward reachable block constraint in which the sequential model includes at a given depth only those reachable control states which are reachable from control states at a lesser depth.

* * * * *